(12) United States Patent
Tomaiuolo et al.

(10) Patent No.: US 6,701,419 B2
(45) Date of Patent: Mar. 2, 2004

(54) INTERLACED MEMORY DEVICE WITH RANDOM OR SEQUENTIAL ACCESS

(75) Inventors: Francesco Tomaiuolo, Monte Sant' Angelo (IT); Salvatore Nicosia, Palermo (IT); Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 201 days.

(21) Appl. No.: 09/977,561

(22) Filed: Oct. 15, 2001

(65) Prior Publication Data

US 2002/0087817 A1 Jul. 4, 2002

(30) Foreign Application Priority Data

Oct. 18, 2000 (EP) .............................. 00830675

(51) Int. Cl.[7] .............................................. G06F 12/00
(52) U.S. Cl. ..................... 711/157; 711/5; 365/230; 365/233; 365/233.5
(58) Field of Search ................ 711/5, 157; 365/230.03, 365/233, 233.5, 239

(56) References Cited

U.S. PATENT DOCUMENTS 5,339,395 A * 8/1994 Pickett et al. ............... 710/305
5,634,139 A * 5/1997 Takita ........................ 710/35
5,691,955 A 11/1997 Yamauchi ................... 365/233
6,356,505 B2 * 3/2002 Nicosia et al. ......... 365/230.09
6,366,634 B2 * 4/2002 De Ambroggi et al. ....... 377/26
6,470,431 B2 * 10/2002 Nicosia et al. .............. 711/157
6,487,140 B2 * 11/2002 Tomaiuolo et al. ......... 365/233
6,587,913 B2 * 7/2003 Campanale et al. ........... 711/5

FOREIGN PATENT DOCUMENTS

EP 0473311 3/1992 ......... G11C/11/408
EP 1020868 7/2000 ......... G11C/11/407

* cited by examiner

*Primary Examiner*—T. Nguyen
(74) *Attorney, Agent, or Firm*—Allen, Dyer, Doppelt, Milbrath & Gilchrist, P.A.; Lisa K. Jorgenson

(57) ABSTRACT

A multipurpose interlaced memory device functions in two different modes, synchronous and asynchronous. The memory uses a circuit for detecting address transitions by acting as a synchronous clock of the system for letting the control circuit of the memory device recognize the required access mode by enabling a comparison of the currently input external address with the one stored in the address counters of the two banks of memory cells. The memory device includes a buffer for outputting data. The buffer includes a circuit for pre-charging the output nodes to an intermediate voltage between the voltages corresponding to the two possible logic states, thus reducing noise and improving transfer time.

32 Claims, 14 Drawing Sheets

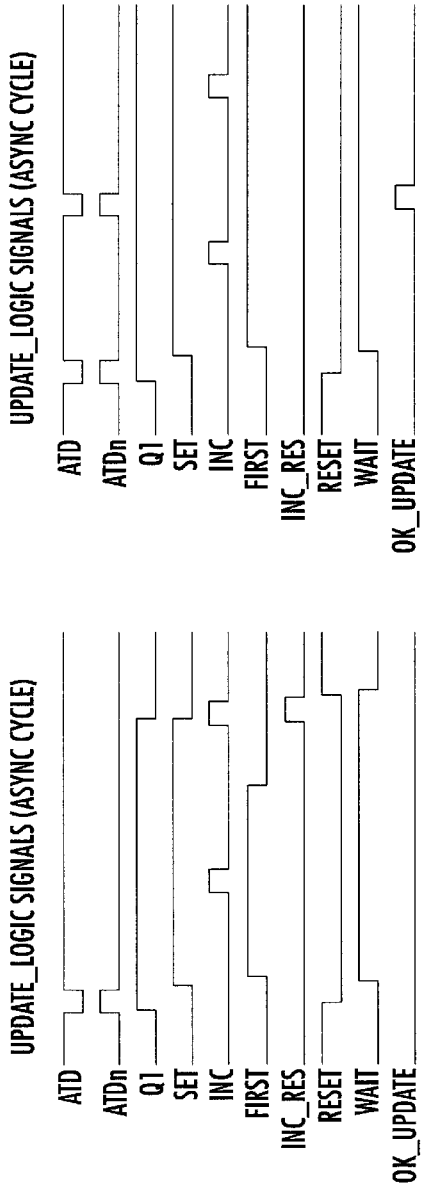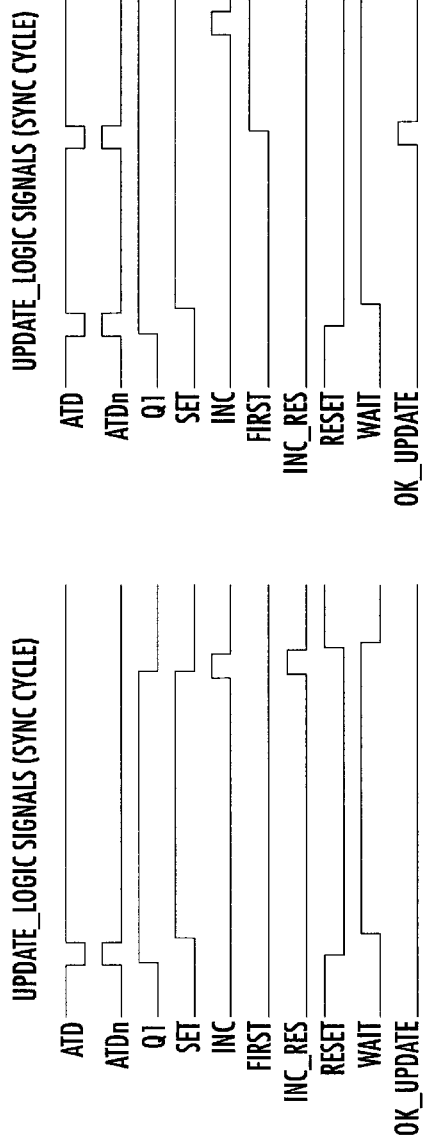

INTERLACED MEMORY DEVICE WITH RANDOM OR SEQUENTIAL ACCESS

FIELD OF THE INVENTION

The present invention relates in general to memory devices, and in particular, to interleaved memories readable in a synchronous mode by successive locations with a sequential type of access that is commonly referred to as burst mode, and to standard memories readable in a random access asynchronous mode with fast access times.

BACKGROUND OF THE INVENTION

In a standard memory, a read cycle is defined from a request of data initiated by the input of a new address, to the final output of the bits stored in the addressed location (byte, word, etc.). Internally, the reading process evolves through several steps. These steps include the acquisition of the new address, its decoding, the generation of synchronizing pulses for the sensing circuits, and the output of the read data, etc. The fundamental steps of a read cycle and the typical control signals that are used for managing it are depicted in FIG. 1.

The address transition detection (ATD) signal recognizes a change of the address input by the external circuitry, and therefore a new access request, and initiates a new read cycle. After enabling the sense amplifiers by the signal SAenable, an equalization of the sensing circuitry takes place. At the end of which, as timed by the signal EQZ, the effective reading of the memory cells takes place. Finally, after a certain interval of time that may vary from device to device, and by way of a signal SAlatch, the recording of the read data into the latches in cascade to the sense amplifiers takes place. This is from where the read word may be transferred to the output buffers.

In memory devices designed for a synchronous read mode with a sequential type (burst) of access, the reading process exploits the fact that the reading takes place by successive locations, that is the subsequent memory location to be read, and therefore its address is predictable from the address of the location being currently read. A subgroup of these sequential (burst) synchronous read mode memories is represented by the so-called interleaved memories. A burst access interleaved memory is described in U.S. Pat. No. 5,559,990.

In this type of memory, the cell array is divided in two semi-arrays or banks, each having its own read circuitry. The read streams of the two banks are thereafter superimposed according to one of the most commonly followed approaches, i.e., outphased from each other. On one of the two banks or semi-arrays the steps of evaluation and transfer of the data to the output are being performed, and on the other bank or semi-array (known as the next location to be addressed) a new read cycle may be started without waiting for the conclusion of the current read cycle that involves the first semi-array.

In interleaved memories, a basic scheme of which is depicted in FIG. 2, the array is divided in two independent banks or semi-arrays, EVEN and ODD, each having its own independent read path. Typically, there are two counters, one for each bank, containing the address of the currently pointed memory location. In case of simultaneous reading processes evolving respectively on the two semi-arrays, the least significant bit of the address (A0) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches: 1) a simultaneous reading and multiplexing of the outputs, and 2) time outphased readings.

According to the first approach, the readings are simultaneous on the two banks. The data read are stored in respective output registers and made available to the outside world in synchronization with an external clock signal. According to the second approach, the readings on the two semi-arrays have an alternate and interleaved evolution on a time base.

The first approach, though offering a simpler hardware implementation, limits the minimization of the start times of synchronous read cycles. For a better comprehension, it is necessary to consider the basic steps that are performed when passing from an asynchronous read mode to a synchronous read mode. With reference to the scheme of FIG. 2, and assuming that the start of which is with the reading from an address X, the latter will be loaded on the EVEN bank counter and on the ODD bank counter, less the least significant bit (A0) of the address. The two counters will point to the same location X of the respective bank or semi-array.

If A0=0, the first read data is relative to the address X of the bank EVEN and the successive read data is the data X of the bank ODD. If A0=1, the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore read the location X+1 of the banks EVEN and ODD. This makes the times of the first read cycle and of the second sequential read cycle at best equal to the asynchronous read mode time of the memory.

In general, it may be stated that the efficient management of the read processes has a direct influence on the performance of the memory device. Many read-path architectures have been proposed. Known read-path architectures have generally been conceived for responding efficiently to either one or the other of the two modes of operation: asynchronous or synchronous.

If a memory device is designed to be read in the asynchronous mode, it will generally be provided with a rather simple control circuitry for the read data streams, utilizing adaptive structures such as dummy wordlines and dummy sense amplifiers, while leaving the reading circuitry free to evolve as fast as possible to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene extensively to manage the sense amplifiers which should not be left to evolve freely but be enabled, equalized and read at precise instants established by the control system. Prior European Patent Application No. EP-98830801, filed on Dec. 30, 1998, and Italian Patent Application No. MI99A00248, filed on Nov. 26, 1999, describe burst-mode EPROM devices with the above characteristics.

A multipurpose memory device that can be used in a broader range of applications, whether requiring the reading of data from the memory in asynchronous mode with random access (as in a standard memory) or the reading of data from the memory in synchronous mode with sequential or burst type access, is disclosed in European Patent Application No. EP-00830068.3, the entire contents of which are incorporated herein by reference, and which is assigned to the assignee of the present invention.

This device is capable of recognizing the mode of access and the reading that is currently required by the microprocessor and the self-conditioning of its internal control circuitry as a function of such a recognition. This is done to read data in the requested mode without requiring the use of additional external control signals and/or implying a penalization in terms of access time and reading time of data compared to those which, for the same fabrication technology and state of the art design, may be attained with memory devices specifically designed for either one or the other mode of operation, that is, random asynchronous access and burst interleaved synchronous access.

Depending on the protocol of the control signals, CEn, OEn and ALE, it is possible to manage the memory device both in synchronous mode as well as in asynchronous mode. In particular, if ALE=1 always, the memory device functions as an asynchronous memory. If ALE is a pulsed signal (FIG. 3), after the first asynchronous reading OEn behaves as a true clock signal, so a new data is output at each rising edge thereof (synchronous readings).

The above mentioned approach, and several other similar approaches, are burdened by the following drawbacks. One drawback is the presence of an additional pin for the additional control signal ALE, which is necessary to catch all external addresses in case of asynchronous access. Another drawback is the incompatibility with standard memory devices in which this additional pin is not expected. A third drawback is the specific protocol that uses the signal OEn as a clock signal for synchronous reading. Yet another drawback is the need of the user to redesign the software and hardware of the system.

SUMMARY OF THE INVENTION

An object of the present invention is to provide a multipurpose memory device that has an interlaced architecture and function, and is fully compatible with standard memory devices.

The control logic of the memory device is capable of recognizing the two following situations: a current address consecutive to the previous one, and a current address not consecutive to the previous one.

In the first case the data is immediately output and the memory device functions in a synchronous mode, where the synchronization is not established by an external clock but by the change of address. In contrast, the second case a new asynchronous reading cycle is started.

In the architecture of the present invention, there are two totally independent and uncorrelated reading paths for the data stored in the two banks or semi-arrays of an interlaced memory device (EVEN and ODD). The memory functions in two different modes, synchronous and asynchronous, using a circuit for detecting address transitions that act as a synchronous clock of the system, which lets the control circuit of the memory device recognize the required access mode by enabling the comparison of the currently input address with the previous one.

Each time that an address not consecutive to the previous one is input, the device internally starts two outphased and independent read cycles relative to the current address and to the immediately successive address. This is done in order to be ready to carry out an eventual possible successive synchronous reading cycle. The device is capable of switching to a synchronous read mode whenever consecutive addresses are input, thus halving the access time.

The memory device of the invention is able to recognize internally whether the currently input address is consecutive to the previous address or not, and in the negative case it produces a signal UPDATE that is used to update the pointers to the memory cells, EVEN_COUNTER and ODD_COUNTER.

The counters of the two banks are incremented separately in order to outphase the readings on the two banks starting from the first read cycle. The two distinct read processes, the one on the pointed bank and the other on the bank not being pointed to, respectively, are congruent with each other and are alternated and interleaved in time.

According to a preferred embodiment of the invention, the memory device comprises a buffer for loading data to be output, and is provided with means that precharge the output node to an intermediate voltage between the voltages corresponding to the two possible logic states of a data, thus reducing noise and optimizing the transfer time.

BRIEF DESCRIPTION OF THE DRAWINGS

The different aspects and advantages of the invention will be even more evident through a detailed description of an embodiment of the invention and by referring to the attached drawings in which:

FIG. 13a–13d shows possible diagrams of the main signals UPDATE LOGIC of the circuit illustrated in FIG. 12.

DETAILED DESCRIPTION OF THE PREFERRED EMBODIMENTS

Figure 1:
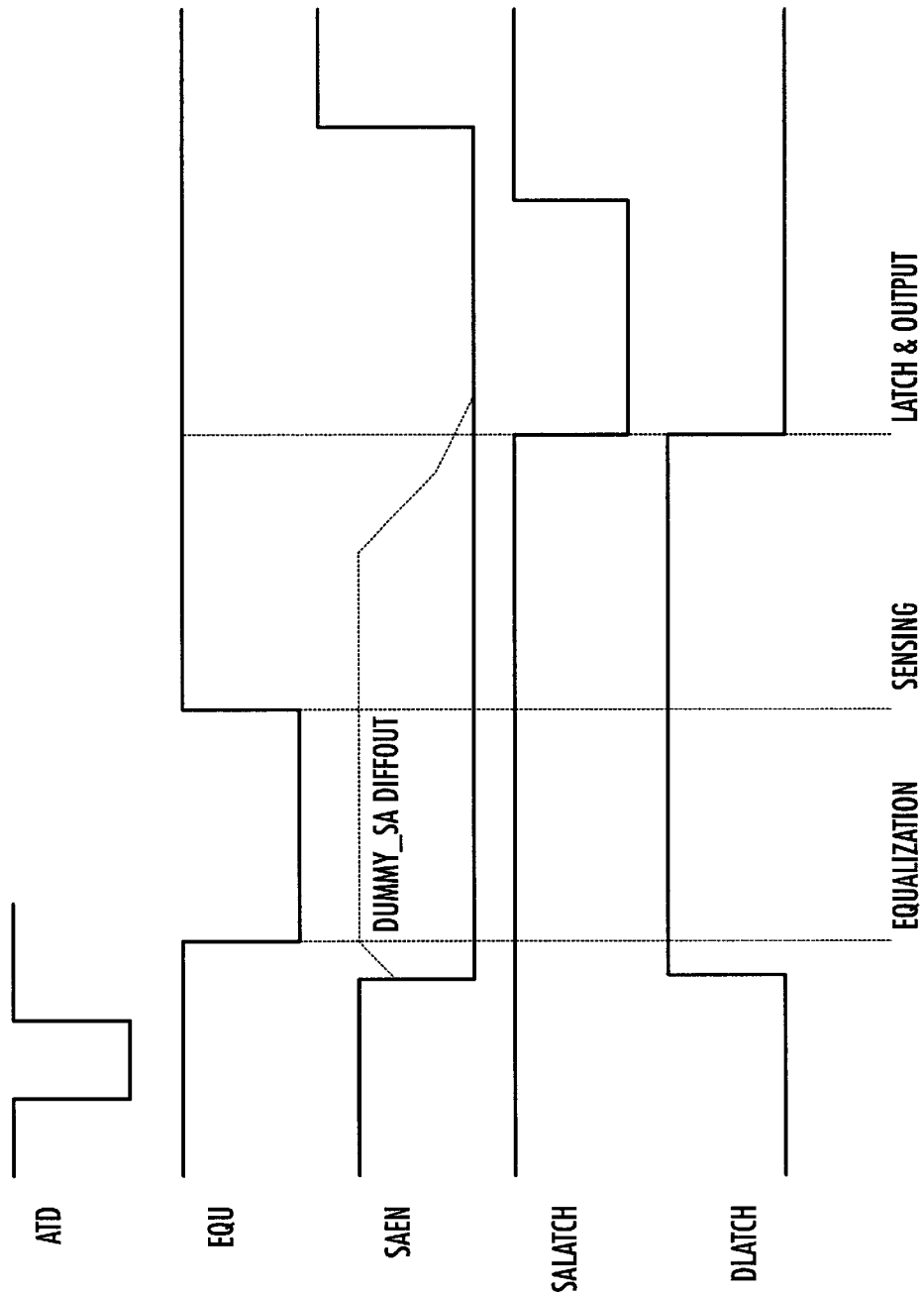
FIG. 1 depicts the main phases of a read access to a conventional memory device according to the prior art.
Figure 2:
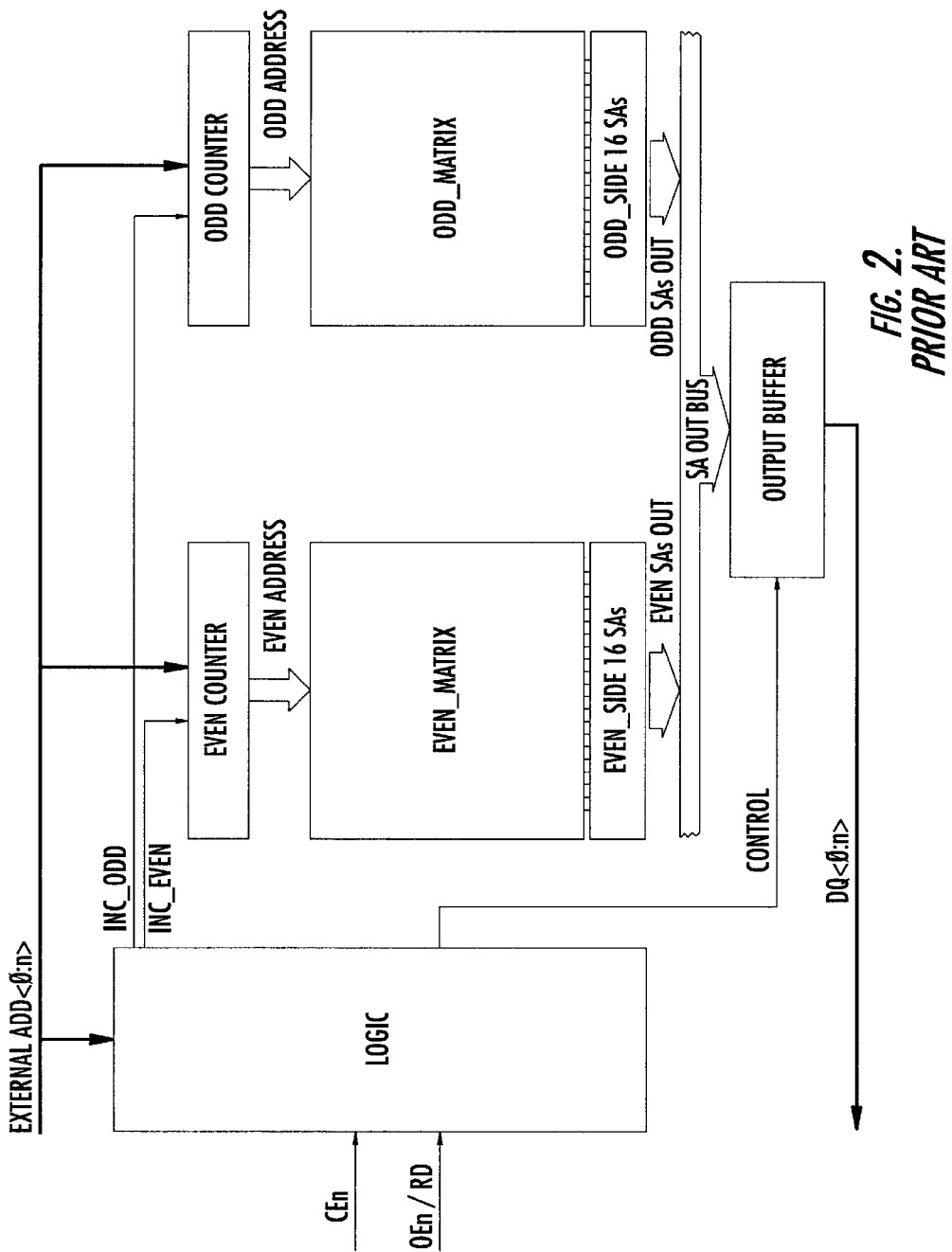
FIG. 2 is a functional diagram of an interlaced memory according to the prior art.
Figure 3:
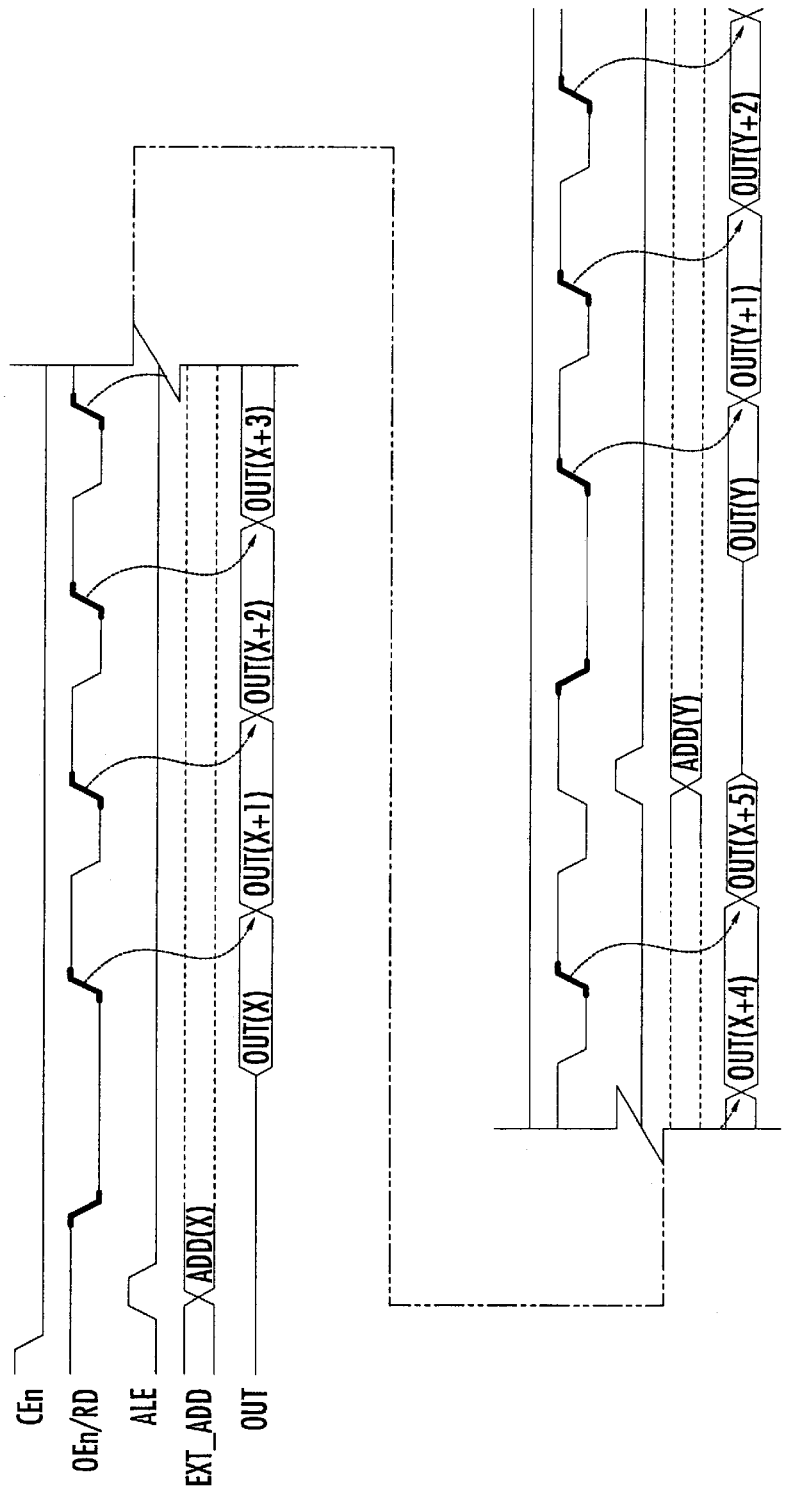
FIG. 3 depicts a specific read access protocol to a known multipurpose memory device according to the prior art.
Figure 4:
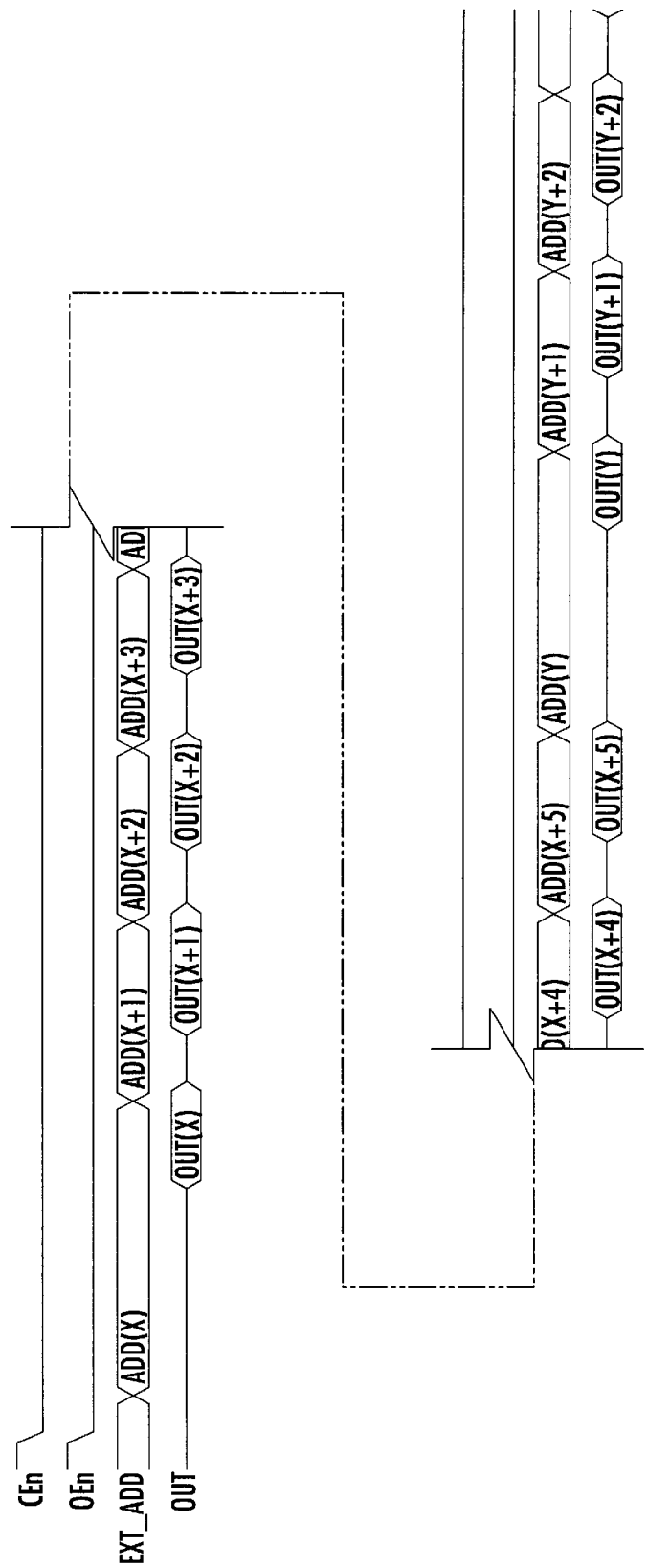
FIG. 4 illustrates the read access protocol of the memory device according to the present invention.
Figure 5:
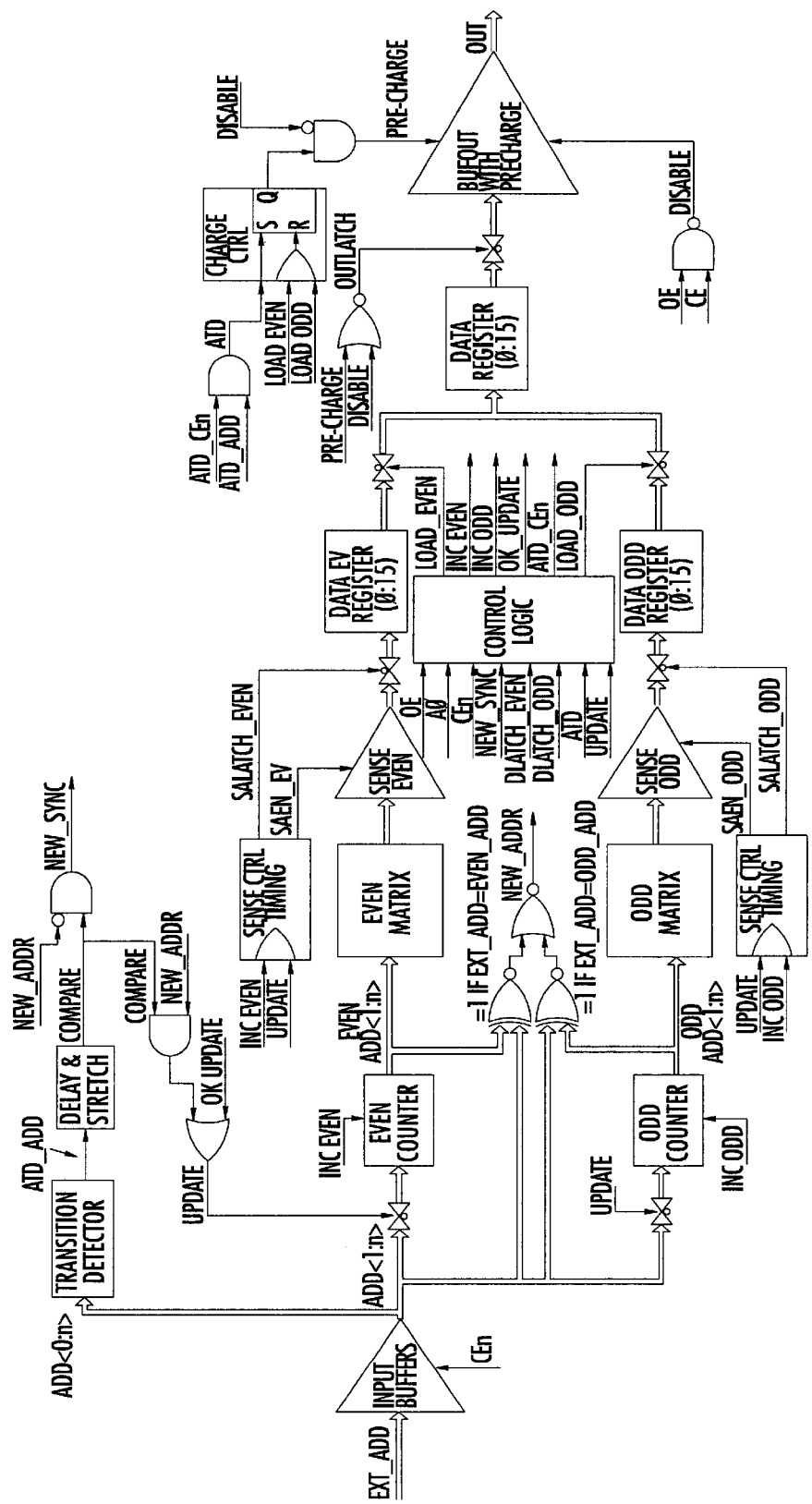
FIG. 5 depicts a preferred embodiment of the memory device according to the present invention.
Figure 6:
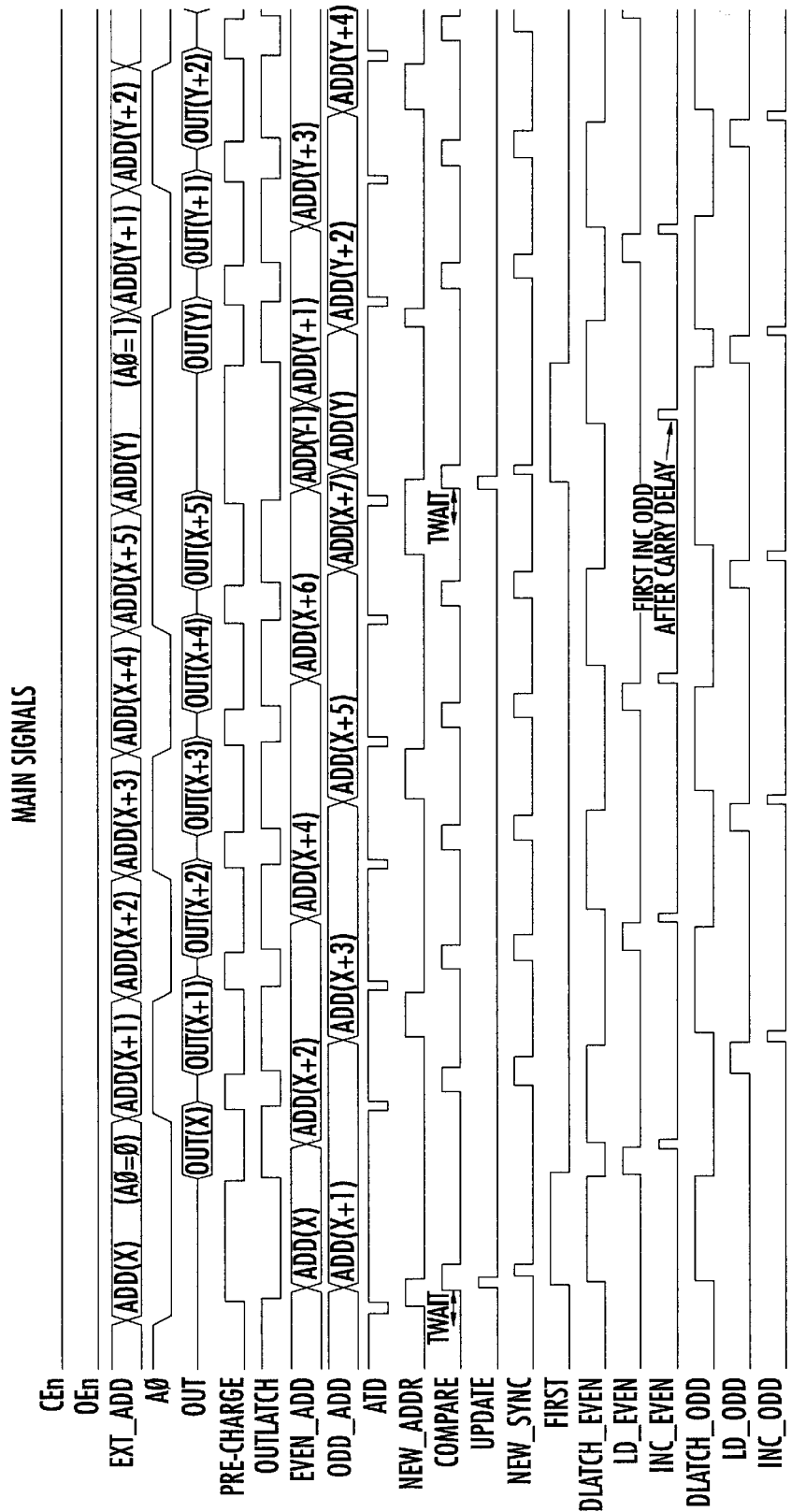
FIG. 6 depicts possible diagrams of the main signals of the memory device illustrated in FIG. 5.

The memory device of the present invention is a multipurpose device that allows for a synchronous or asynchronous access using the same access protocol of a standard memory device, as depicted in FIG. 4. The start of a conventional (asynchronous) read cycle takes place by inputting an address not consecutive to the previous one. Upon recognizing this condition, the address counters of the memory device acquire the external address and the read cycles of the two memory banks are simultaneously started. A block diagram of a preferred embodiment of the invention is depicted in FIG. 5, while the main signals are depicted in FIG. 6.

In an asynchronous cycle the two independent arrays of sense amplifiers SENSE_EVEN, SENSE_ODD of the two memory banks are enabled at the same time by the pulse UPDATE, but only the sense amplifiers of the memory bank in a state of priority identified by the logic value of the least significant bit A0 of the address are enabled. This is done by placing the read data on the internal data bus.

In the phase that immediately follows the start of a read cycle, when it is acknowledged that the address has been acquired in the counters and the carry has propagated, if the first bank in priority is the ODD bank the block CONTROL_LOGIC generates a first increment pulse for the counter EVEN on the relative bank EVEN of which the read cycle pertaining to the next successive address takes place.

By doing so, reading of the bank having priority evolves freely because this bank will be called first to deliver the data read to the output. At the same time the incremented address for the successive reading on the other bank is prepared. This is the start of a burst interleaved synchronous read process.

The same increment signal for the bank that is not in priority stimulates the respective circuit SENSE CTRL TIMING managing the sense amplifiers SENSE_EVEN, SENSE_ODD. This is so that the array of sense amplifiers, the managing circuit SENSE CTRL TIMING, the dummy equalization structures, etc., will process the increment pulse as a normal request of an asynchronous reading and will be restarted, while the sense amplifiers of the bank in priority, being independent from those of the other bank, will continue to evolve through the reading phase.

The control circuit will continue to monitor the signals coming from the block SENSE CTRL TIMING of the bank in priority and, as soon as it generates the signal DLATCH for transferring the read data to the latch in cascade of the sense amplifiers, will produce the pulse LOAD for loading the read data in the output latch. The falling (trailing) edge of the pulse LOAD establishes that the bank that has just terminated the reading is ready to start a new read cycle. A new increment signal will be produced only for the counter of this bank, and besides stimulating the generation of the new internal address, will restart the reading exclusively for this bank.

Once again the control circuit waits for information coming from the external input bus or from the self-adapting structure of the SENSE CTRL TIMING to enable the outputting of data of the other bank. This is done by the generation of a new pulse LOAD or the start a new asynchronous read cycle. The above described operations may repeat themselves indefinitely, alternating the sequence.

The signal OEn (Output Enable) is a low-active external command for enabling the output buffers. Thus, if the signal assumes the logic level 0, the data of the bank in priority are transferred to the output buffers and are made available external the memory device.

The circuit for detecting address transitions TRANSITION_DETECTOR produces a detection pulse ATD_ADD starting from which the pulse signals that allow the comparison between the external address and the address stored in the address counters are generated. The address consecutive to the one of the last completed readings is present in the counter of the bank that is currently not in priority. If the external address is equal to this address, the relative data can be output and a new reading on this bank may start again.

Each time the external address EXT_ADD is modified, the block TRANSITION_DETECTOR produces a pulse ATD_ADD that is suitably delayed and stretched by the block DELAY&STRETCH. This block produces the signal COMPARE as a delayed and stretched version of the pulse ATD_ADD in order to account for the processing time of the signal NEW_ADDR.

At the same time the external address is compared with the address stored in counters of both banks. If the address is different from the one contained in both counters, the signal NEW_ADDR that represents the result of the comparison switches to 1. This indicates to the system that an address not consecutive to the previous one has been input and that an asynchronous reading cycle is required. Therefore, if NEW_ADDR=1 and COMPARE=1 then UPDATE is active, thus enabling the storing of the new address in the counters by enabling the pass gates that couple the output of INPUT_BUFFERS to the counters themselves. This also stimulates the blocks SENSE CTRL TIMING that manage the sense amplifiers SENSE_EVEN, SENSE_ODD of the two blocks during the various phases of the read cycle.

The blocks SENSE CTRL TIMING may be similar to that described in European Patent Application No. EP-00830068.3. That is, they are self-adaptive structures suitable to manage the timing of the read phases of the sense amplifiers. If A0=0, the two banks proceed in parallel during the first reading cycle and when the sense amplifiers terminate their evaluation phase, the read data are latched in their respective DATA_REGISTER. On the contrary, if A0=1 the reading cycle is started on the bank EVEN after having incremented the address present in its address counter.

In any case, in both situations the bank in priority (EVEN if A0=0, ODD if A0=1) continues executing its read cycle and outputs the read data, successively it increases the address contained in its address counter and restarts a new read cycle. Should the external address change and the new address be consecutive to the previous one, the signals ATD_ADD and COMPARE are generated again as discussed above.

Because at least one of the address counters contains "a copy"of the external address, the result of the comparison between the external address and the address stored in the counters will be positive and when COMPARE=1, NEW_ADDR=0. In this case, unlike in the previous case, the signal UPDATE remains disabled.

On the other side, because NEW_ADDR=0 when COMPARE=1 a read stimulation signal NEW_SYNC is produced by the AND gate in cascade to the block DELAY&STRETCH. The NEW_SYNC signal contains the information relative to the fact that the user requires new data and that the address in which it is stored is consecutive to the previous one. Therefore, if the reading relative to this new address is terminated, that is, the sense amplifiers have already placed into the relative DATA_REGISTER latch the read data, the data is output and a new read cycle is started onto the same bank. This is after having incremented its address counter. If on the contrary the reading has not yet finished, the system waits for the end of the read cycle.

The memory device of the invention, if used always in an asynchronous mode, could be performing slightly less than a standard asynchronous memory device because of the delay introduced in the phase that immediately follows the change of the external address in order to recognize the required read mode, i.e., synchronous or asynchronous.

Figure 14:
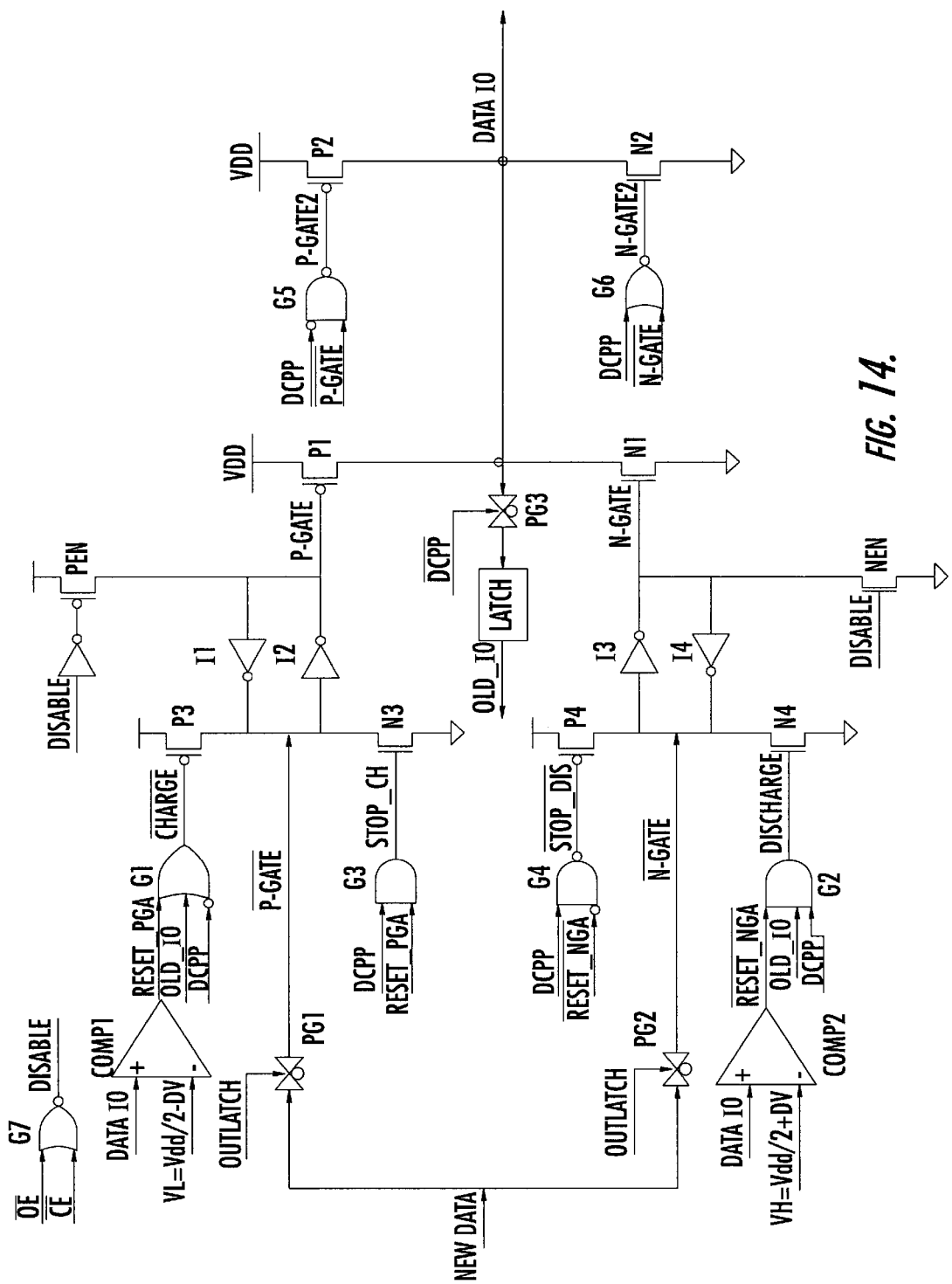
FIG. 14 shows a preferred embodiment of an output buffer of the memory according to the present invention, provided with output precharge means.

To prevent this drawback, a buffer provided with means for pre-charging the output node is used, as the one depicted in FIG. 14. This buffer brings the output node to an intermediate voltage Vcc/2 between the voltages relative to the two logic states upon the internal generation of a precharge pulse PRE_CHARGE, and lets the voltage on the output node evolve freely when the data to output is available (LOAD=1). Using this approach, the performance of the memory device of the invention is practically unaffected by any additional delay when functioning in an asynchronous mode.

Referring to FIG. 5, each time a pulse ATD is produced, the block CHARGE_CONTROL generates a precharge signal PRECHARGE of the output node, thus setting it at the voltage Vcc/2. The pulse ATD is obtained as a logic AND between the control pulses ATD_CEn and the address transition detection pulse ATD_ADD, and indicates that an address transition or a resume from a stand-by state has occurred.

The precharge phase of the output node stops when the block CONTROL_LOGIC enables the output of the data read by the sense amplifiers by way of the signals LOAD_EVEN and LOAD_ODD. This phase is further conditioned by the state of the signal DISABLE that sets in a high impedance state the outputs, and depends from the state of signals CEn and OEn. During the precharge of the output node and when the outputs are set in a high impedance state, the path from the DATA_REGISTER to the output buffer is interrupted because the signal OUTLATCH is forced low by the NOR gate input with the above mentioned signals PRE_CHARGE and DISABLE.

By monitoring the state of the external signals, CEn, OEn and A0 and of the asynchronous internal signals generated by the two blocks SENSE CTRL TIMING that manage the reading phases and of the other internally generated signals NEW_SYNC, ATD and UPDATE, the block CONTROL_LOGIC controls the following. The start of a new read cycle and the increment of the address counters by generating the signals INC_EVEN and INC_ODD. The loading of the read data from the output latches of the sense structures of the two banks DATA_ODD_REGISTER, DATA_EV_REGISTER into the output register that precedes the output buffers by generating the signals LOAD_EVEN and LOAD_ODD. The start of asynchronous readings in the following cases: resume from stand-by state, and loss of synchronization due to excessively fast address changes (out of specifications).

Figure 7:
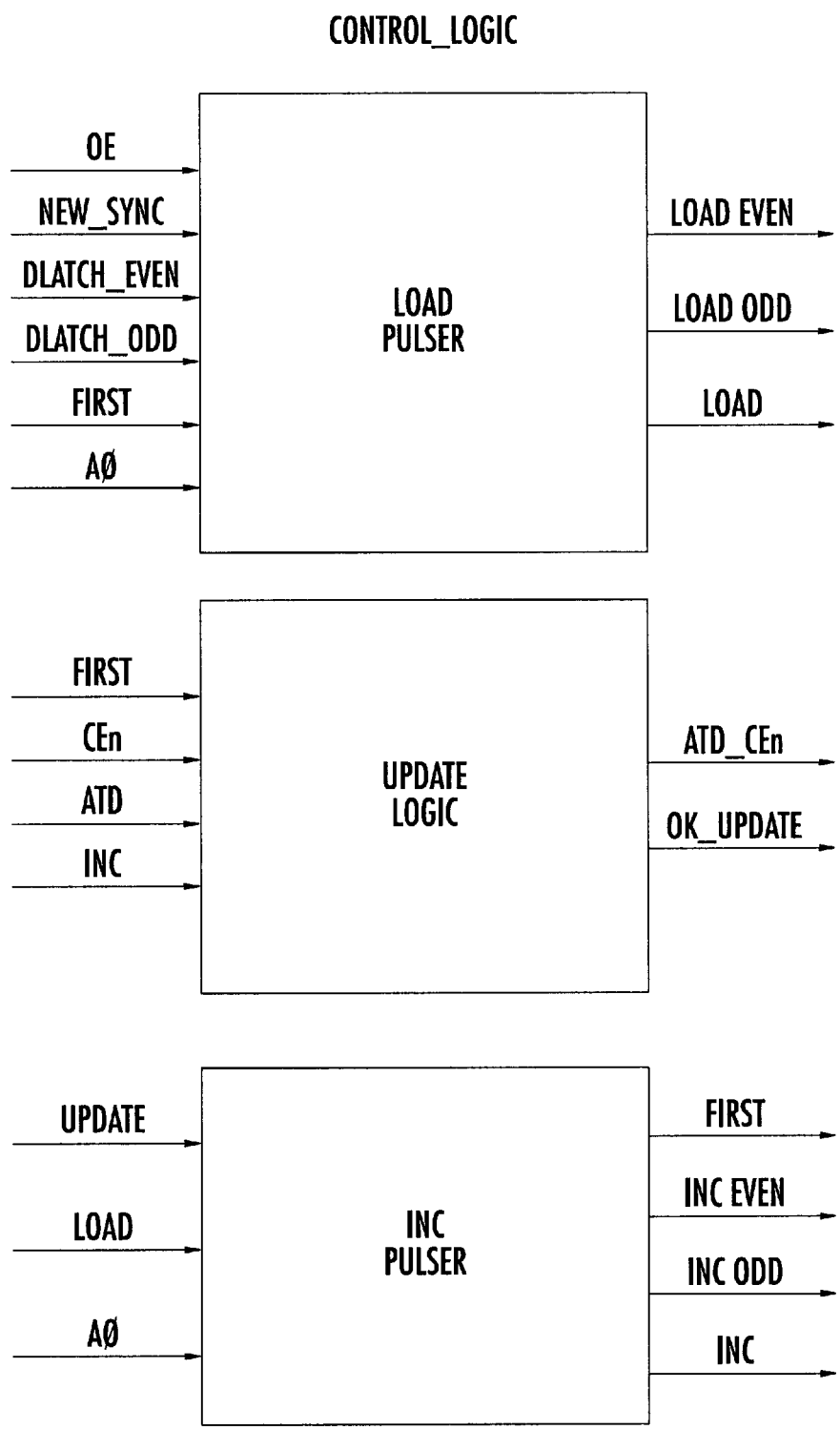
FIG. 7 is a basic block diagram of the CONTROL LOGIC circuit illustrated in FIG. 5.

The block CONTROL_LOGIC is formed by three main circuits, as depicted in FIG. 7. These circuits include a load circuit, a generator, and a restart circuit. The load circuit LOAD_PULSER produces pulses for loading read data in the output register. The generator INC_PULSER generates increment pulses for the address counters and for starting new read cycles in the two banks. A restart circuit UPDATE_LOGIC recognizes irregular conditions in which an asynchronous read cycle must restart and generate the signals ATD_CEn and OK_UPDATE.

The single functional circuits are described below in a more detailed manner. The LOAD PULSER circuit has the following characteristics. It produces the pulses necessary for loading the read data in the latch that precedes the output buffer. During the first asynchronous reading it is stimulated by the signal DLATCH to produce the first load pulse LOAD. In the successive synchronous readings it is stimulated by the switching of the external address monitored by way of the signal NEW_SYNC. This circuit is also able to synchronize the user request of new data with its availability, and depending on the address A0, it allows the loading of the data EVEN or the data ODD.

Figure 8:
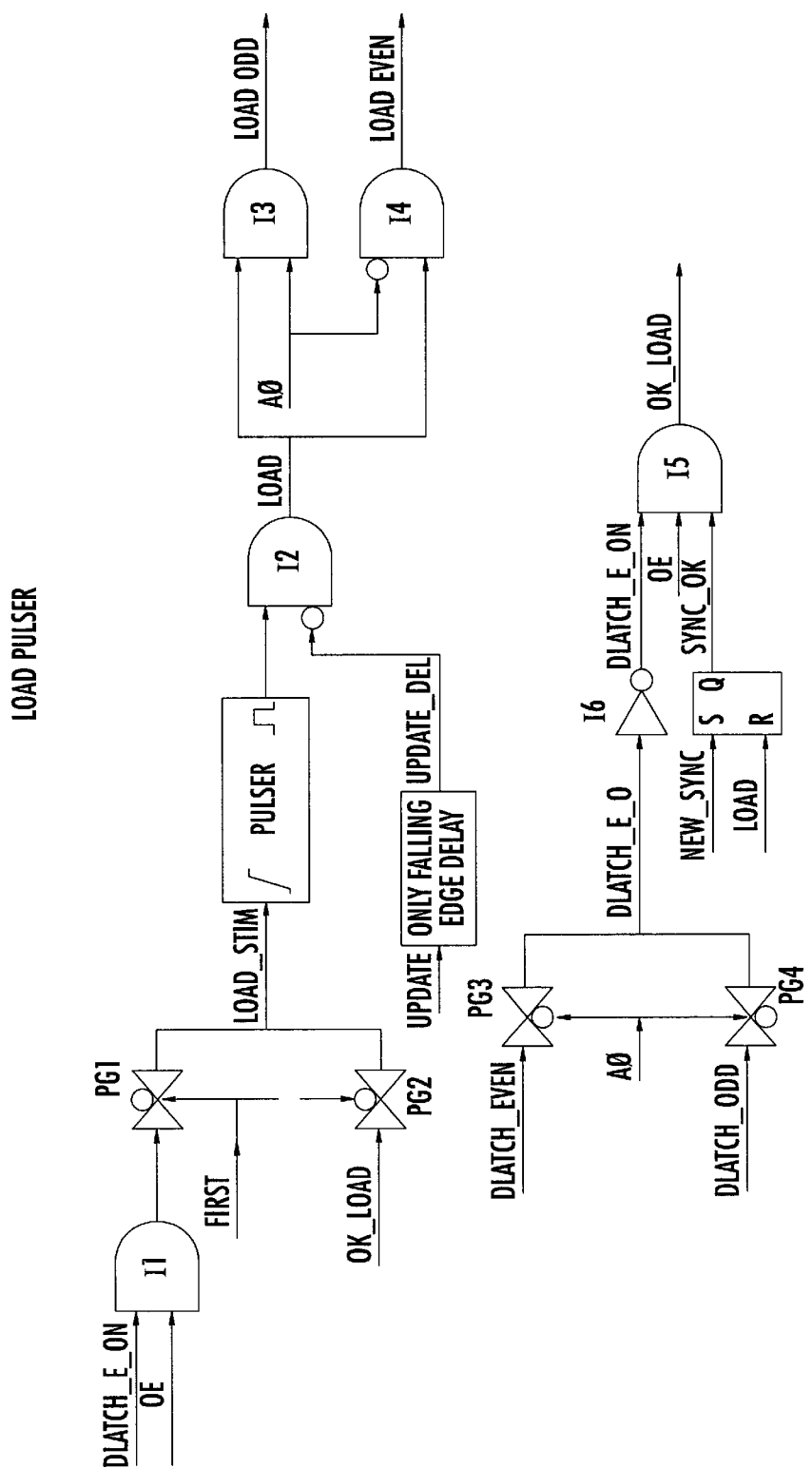
FIG. 8 depicts a preferred embodiment of the LOAD PULSAR circuit illustrated in FIG. 7.
Figure 9:
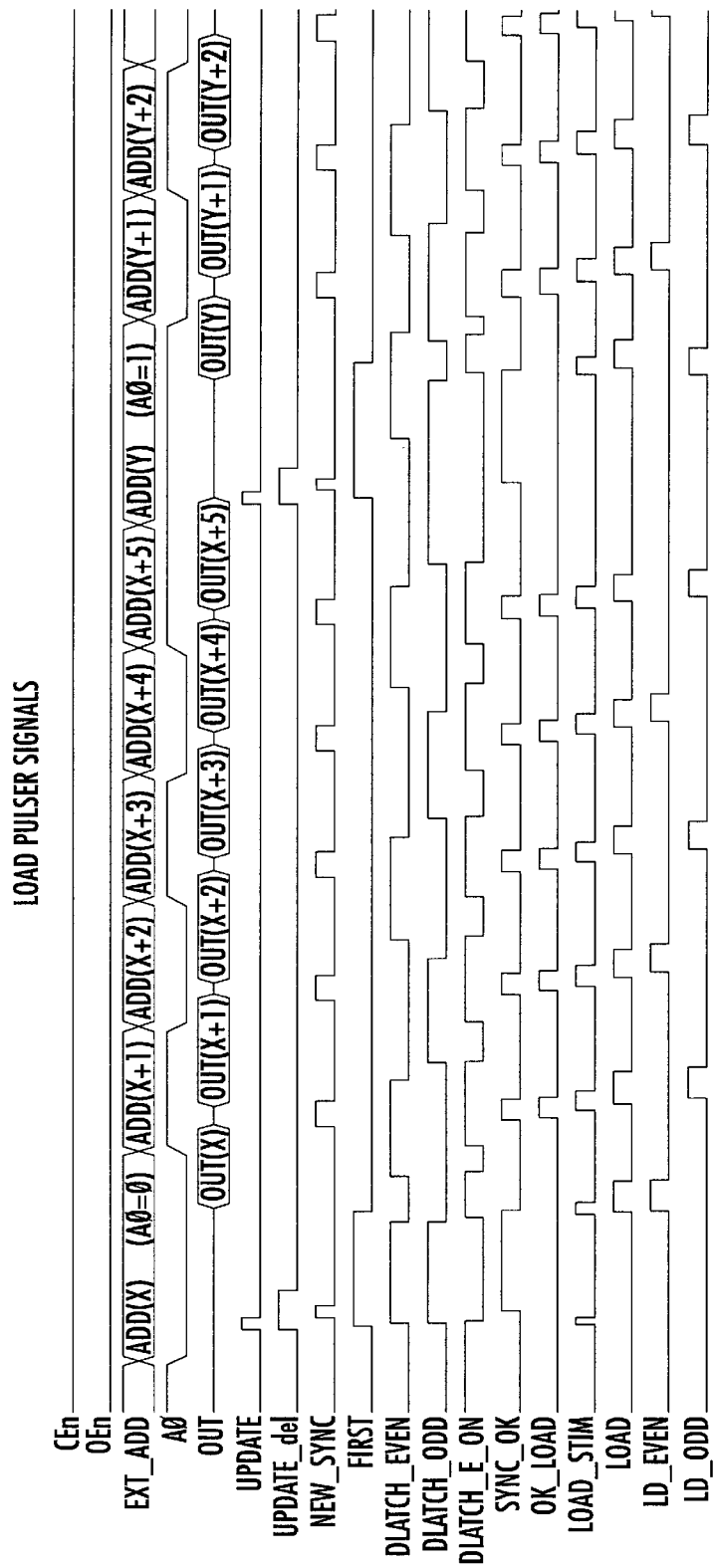
FIG. 9 shows possible diagrams of the main signals of the LOAD PULSAR circuit illustrated in FIG. 8.
Figure 10:
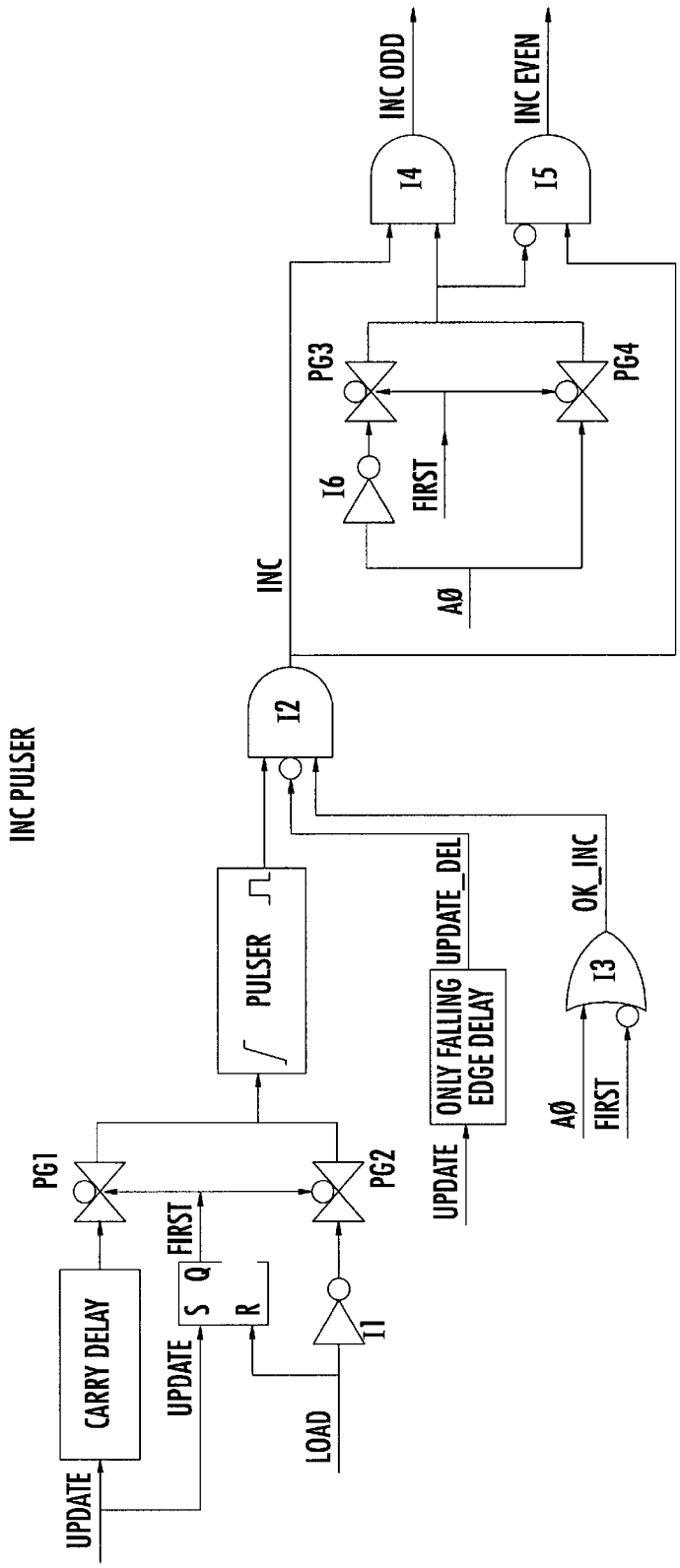
FIG. 10 shows a preferred embodiment of the INC PULSAR circuit illustrated in FIG. 7 for producing increment pulses.
Figure 11:
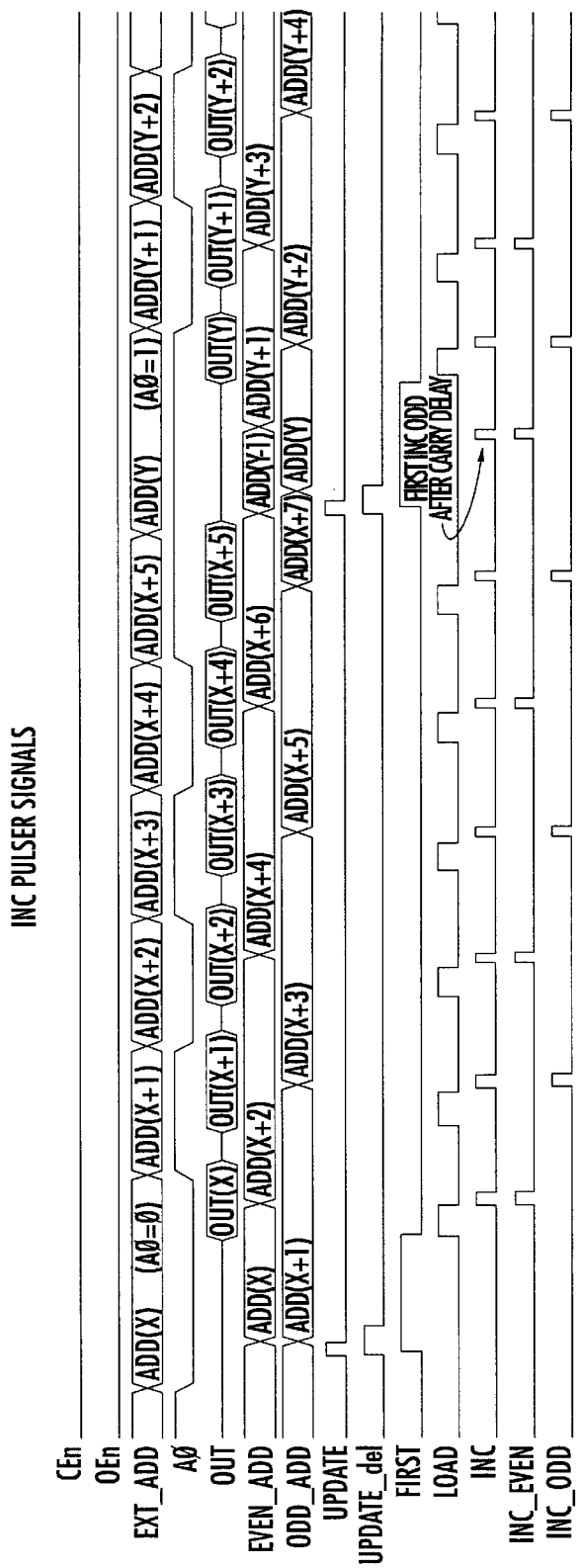
FIG. 11 shows possible diagrams of the main signals of the INC PULSAR circuit illustrated in FIG. 10.

A block diagram of a possible embodiment of the circuit is depicted in FIG. 8, while FIG. 9 illustrates the time evolution of the main signals. In FIG. 8 a block PULSER is depicted for producing a pulse of a certain duration each time it is stimulated by a transition 0 to 1 of the signal LOAD_STIM. In the first asynchronous reading (FIRST=1), the signal LOAD_STIM is the logic AND between the logic negation of the external enabling command of the output buffer OE and the signal DLATCH_E_On. The first signal (OE) contains the information relative to the enabling of the output buffer of the memory, the second (DLATCH_E_On) contains the information that the reading in progress has ended and the respective data latches in cascade to the sense amplifiers SENSE_EVEN, SENSE_ODD have been updated.

In the successive synchronous readings, LOAD_STIM coincides with the signal OK_LOAD (FIRST=0) that is produced when any one of the following conditions is verified: change of the external address with a new address consecutive to the previous one (NEW_SYNC=1); external enabling of the output bus (OE=1); and end of the reading on the bank in priority, i.e., the reading relative to the new address (DLATCH of the bank in priority=0).

The latch SR that produces the signal SYNC_OK is set every time a new address successive to the previous one is input (NEW_SYNC=1) and is reset when the output registers are updated by a LOAD pulse. The block ONLY_FALLING_EDGE_DELAY delays only the falling edge of the start signal UPDATE of an asynchronous reading by producing the signal UPDATE_DEL. This signal is logically inverted and ANDed with the output of the pulse generator PULSER, and its function is to interrupt an eventual pulse LOAD when a new asynchronous reading starts. Finally the demultiplexer controlled by the state of A0 (formed by the gates I3 and I4) directs the pulse LOAD towards the bank in priority.

The main functions of the circuit INC PULSER are as follows. The pulses that are necessary to increment the addresses stored in the address counters of the two banks are produced and the asynchronous readings are started. The first increment is produced considering the propagation delay of the carry through the counter. The first increment is suppressed if the asynchronous reading starts from an address on the EVEN bank. The main functions also include producing at the end of the respective read cycles the next increments for each of the two banks, producing a signal FIRST capable of discriminating the first asynchronous reading from the successive synchronous readings, and updating the pointer to the banks EVEN and ODD as a function of the address A0.

The circuit includes a pulse generator PULSER stimulated by a signal output by the multiplexer formed by the two pass gates PG1, PG2. The multiplexer is controlled by the signal FIRST that discriminates the first asynchronous read cycle from the successive synchronous ones.

The signal FIRST is generated by a latch SR, set by the start signal UPDATE of the asynchronous reading and reset by the signal LOAD that enables the loading of the data read from the sense amplifiers, thus stating the end of the first asynchronous read cycle. Therefore, during the first asynchronous reading, the pulse generator PULSER is stimulated by a replica of the signal UPDATE, delayed by the block CARRY_DELAY, to account for the propagation delay of the carry bit through the counter.

During the following synchronous readings, PULSER is stimulated by the logic negation of the signal LOAD to allow, at the end of the pulse LOAD, the increment of the address counter and the start of a new reading on the bank that has just terminated the current read cycle.

The pulse output by the pulse generator is logically filtered in the following situations. In the case of a first asynchronous reading EVEN (A0=0 and FIRST=1), during which, as already stated, it is not necessary to increase the ODD bank because its address counter already contains the correct address. In this situation OK_INC=0 in the case of eventual increments being in progress at the start of a new asynchronous reading cycle (UPDATE=1) that update the content of the counters with the new external address.

The block ONLY_FALLING_EDGE_DELAY delays only the falling edge of the signal UPDATE producing the signal UPDATE_DEL that, when it is at the high logic level, filters the increment. The pulse INC is correctly directed to the banks EVEN and ODD through the demultiplexer formed by the AND gates I4 and I5 and controlled by the following. A first case is the signal A0 when FIRST=0. In this case the increment is provided to the bank in priority that has just made available the read data. A second case is the logic negation of the signal A0 when FIRST=1. In this case the increment is provided to the bank that is not in priority. In fact, if the first asynchronous reading starts on the bank ODD, the first increment pulse must be provided to the counter EVEN.

Figure 12:
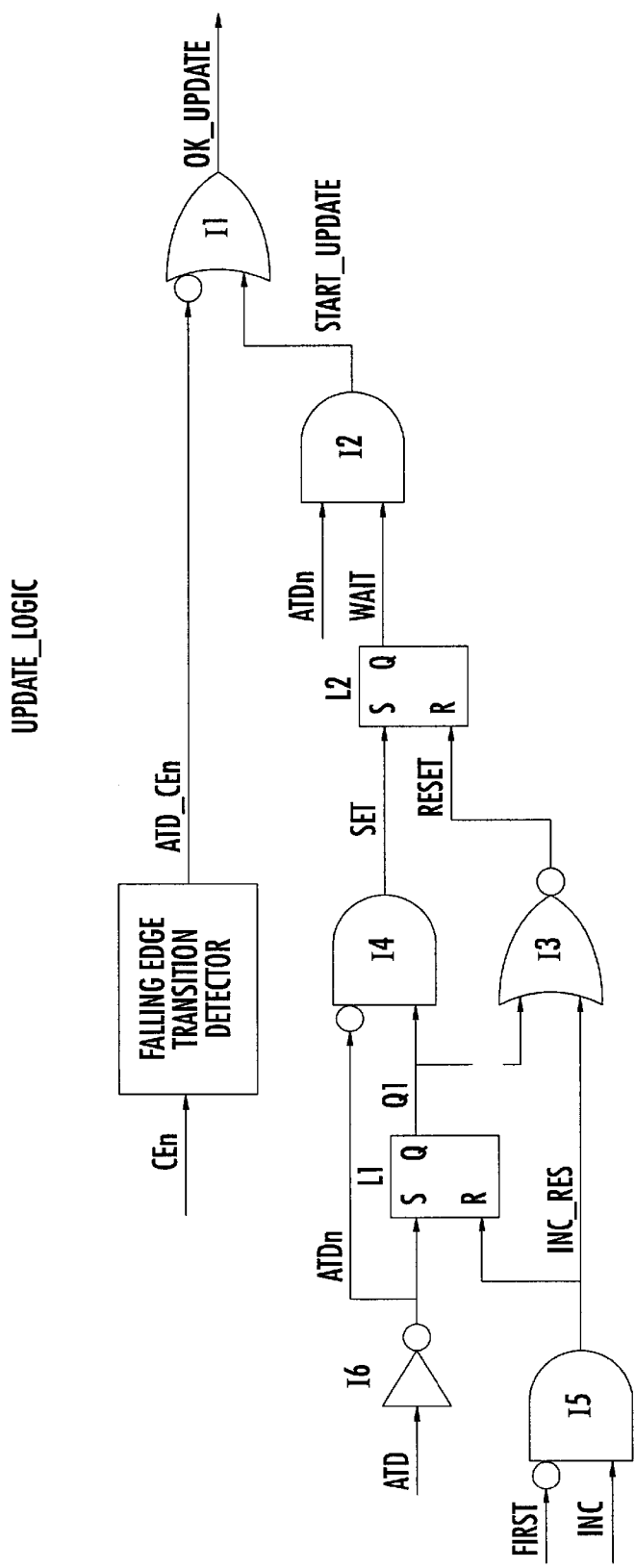
FIG. 12 depicts a preferred embodiment of the UPDATE LOGIC circuit illustrated in FIG. 7.

The main function of the restart circuit UPDATE LOGIC is to recognize the situations in which the memory must start a new asynchronous reading cycle by producing a start signal of asynchronous reading (OK_UPDATE=1). A possible embodiment of this restart circuit is depicted in FIG. 12, and diagrams of the internal signals when the block is active are depicted in FIG. 13.

An asynchronous reading cycle must start in the following cases. A first case is to resume from a stand-by state. In this case the block FALLING_EDGE_TRANSITION_DETECTOR produces, on the falling edge of the external command of enablement of the memory device CEn, a control pulse ATD_CEn that is logically negated and ORed with the signal START_UPDATE, thus generating the signal for starting an asynchronous reading cycle OK_UPDATE. A second case is the loss of synchronization caused by an excessive frequency with which the user requires data. For example, the user changes the address before the end of a first asynchronous reading cycle. In this situation the reading must restart and the state machine must return to its initial state. During synchronous mode, the user requires new data (changes the address X in X+1) before the cycle relative to the previous reading is completed. That is, the increment pulse for the address counter is produced while the data X is yet to be loaded in the output.

Each time the external address changes, a pulse ATD is generated and the block UPDATE_LOGIC must either produce the signal OK_UPDATE depending on a state of the memory device. The irregular situation in which the user requires new data (by changing the external address) before the end of the reading relative to the current address with the consequent outputting of the read data and the incrementing of the counter of the bank in priority, is recognized by detecting two consecutive pulses ATD not interleaved by a general increment pulse INC.

In fact, in the first asynchronous cycle, if during the reading the user inputs a different address, a new pulse ATD preceding the general increment pulse INC of the bank in priority is produced. The eventual first pulse INC provided to the bank not in priority is filtered by the signal FIRST by the gate I5.

Similarly, during synchronous reading, if the user changes two or more times the input address before the memory is able to load in output the read data and to restart the reading in the memory bank (INC=1), the generation of two or more successive ATD pulses, not interleaved with general increment pulses INC, makes the circuit detect an anomalous situation and restart a new asynchronous reading (OK_UPDATE=1). The frequency with which data are requested is greater than the maximum frequency of the system. Therefore, when the address stabilizes itself, the memory correctly provides the respective data and this happens because for such an address input out of synchronization an asynchronous reading is carried out.

In the LATCH L1 is stored the information relative to the state of the process that begins with the request of new data (ATD=0) and terminates with the loading in output of the read data, with a consequent start of a new reading on the bank in priority (INC=1).

In particular, a pulse ATD after having been logically negated sets Q1 to 1. Q1 will be reset to 0 only by a general increment pulse INC, as long as it is not the INC pulse that is produced during the first asynchronous reading to increment the bank EVEN when the first asynchronous reading starts on the bank ODD. Such an INC pulse is in fact filtered by the AND gate I5 by using the logic negation of the signal FIRST.

The signal Q1 enables, at the end of the pulse ATD, to force to 1 the signal SET (I4) which in turn sets to 1 the output WAIT of the LATCH L2. The signal WAIT, when at a high logic level, carries the information that a first pulse ATD has been detected. Therefore, a successive pulse ATDn arriving in this phase produces, through I2, a pulse START_UPDATE that in turn produces a restart signal OK_UPDATE of an asynchronous cycle.

This does not happen if the new pulse ATD is preceded by a pulse INC that resets the latch L1 (Q1 to 0) on the rising edge and the latch L2 (WAIT to 0) on the falling edge, thus keeping the signal START_UPDATE disabled. The time evolution of the signals of this circuit, in the case in which there is a normal first asynchronous read cycle, is depicted in FIG. 13a.

The situation in which the new ATD, produced by an abrupt change of address by the user, causes the generation of a pulse OK_UPDATE, is depicted in FIG. 13b. FIG. 13c highlights a possible time evolution of the signals in the case of a standard synchronous reading phase, while FIG. 13d illustrates the situation in which the new pulse ATD follows a previous one without being preceded by a general increment pulse INC, thus causing the generation of the pulse OK_UPDATE.

That which is claimed is:

1. An interleaved memory readable in a sequential access synchronous mode and in a random access asynchronous mode, said interleaved memory comprising:

first and second banks of memory cells;

at least one input address buffer;

a first address counter connected between said first bank of memory cells and said at least one input address buffer, and a second address counter connected between said second bank of memory cells and said at least one input address buffer;

a first sensing circuit connected to said first bank of memory cells, and a second sensing circuit connected to said second bank of memory cells;

an address transition detector connected to said at least one input address buffer for producing a detection pulse based upon a change in an input address received by said at least one input address buffer;

a delay circuit connected to said address transition detector for delaying and extending duration of the detection pulse for producing a detection signal;

at least one output data buffer;

an internal data bus for transferring data in said first and second sensing circuits to said at least one output data buffer under control of a load signal specific to one of said first and second banks of memory cells; and a control circuit having inputs for receiving external command signals for enabling the memory and for enabling said at least one output data buffer, said control circuit for generating the load signal, discriminating a requested reading mode based upon an internally generated synchronous read start signal and an asynchronous read start signal, with the synchronous read start signal being active when a new address coincides with an address stored in one of said first and second address counters based upon enabling of the detection signal, the asynchronous read start signal assuming a first logic state when the new address differs from addresses stored in said first and second address counters based upon the enabling of the detection signal, with a transition to the first logic state of the asynchronous read start signal enabling acquisition of an address in said first and second address counters and start of a new random access asynchronous read cycle with a simultaneous activation of said first and second sensing circuits, with the external command signal for enabling said at least one output data buffer acting as an enabling signal for transferring data read from said first and second banks of memory cells currently in priority to said at least one output data buffer, based upon a value of a least significant address bit of the input address, and returning of the asynchronous read start signal to a second logic state causes after a certain delay switching to the sequential access synchronous read mode by generating, within said control circuit, a first increment pulse for said first or second address counter of said first or second bank of memory cells currently not in priority, for implementing an outphasing between said first and second bank of memory cells from a first synchronous mode read cycle depending on the value assumed by the least significant address bit, and progressing under control of the synchronous read start signal and under control of a third command signal for loading data in said at least one output data buffer for a sequential reading of stored data, with the third command signal being internally generated in said control circuit.

2. An interleaved memory according to claim 1, wherein said first and second sensing circuits are functionally independent from each other.

3. An interleaved memory according to claim 1, further comprising:

a first data register connected between said first sensing circuit and said at least one output data buffer; and a second data register connected between said second sensing circuit and said at least one output data buffer.

4. An interleaved memory according to claim 1, wherein the asynchronous read start signal assumes the first logic state when a restart signal for an asynchronous reading produced by said control circuit is active.

5. An interleaved memory according to claim 4, wherein said control circuit comprises:

an increment circuit for generating increment pulses for said first and second address counters, and being stimulated by the asynchronous read start signal during a first asynchronous reading and by the load pulse during synchronous readings successive to the first asynchronous read;

a load circuit for producing load commands equal to the load pulse based upon the least significant address bit identifying one of said first and second banks of memory cells, with the load pulse being produced based upon the asynchronous read start signal and transfer signals of data read from said first and second banks of memory cells; and a restart circuit for producing the restart signal for the asynchronous reading when a change of address occurs before an end of a synchronous or asynchronous read cycle.

6. An interleaved memory according to claim 5, wherein said increment circuit comprises:

a latch being set by the asynchronous read start signal and being reset by the load pulse, and producing a discrimination signal for discriminating an asynchronous read from a successive synchronous read;

a first multiplexer controlled by the discrimination signal and having an input for receiving a delayed replica of the asynchronous read start signal and an inverted load pulse;

a pulse generator connected in cascade to said first multiplexer for producing a pulse having a pre-established duration when an output of said first multiplexer is enabled;

a logic circuit for producing a general increment pulse as a logic AND between the pulse produced by said pulse generator and an inverted asynchronous read start signal delayed on a transition edge from a first logic state to a second logic state, and a logic OR between the least significant address bit identifying one of the said first and second banks of memory cells and an inverted discriminating signal;

a second multiplexer controlled by the discrimination signal and having an input for receiving the least significant address bit and an inverted least significant address bit; and a logic circuit for producing the increment pulse as a logic AND between the general increment pulse and an inverted output signal from said second multiplexer, or as a logic AND between the general increment pulse and the output signal from said second multiplexer.

7. An interleaved memory according to claim 6, wherein said restart circuit comprises:

a pulse generator for producing a control pulse based upon activation of the external command signal for enabling the memory;

a first latch being set by an inverted second detection signal obtained as a logic AND between a control pulse and the detection pulse, and being reset by a reset signal obtained as logic AND between the general increment pulse and an inverted discrimination signal;

a second latch being set by a logic AND of an output of said first latch and a second detection signal, and being reset by a logic NOR of an output of said first latch and the reset signal; and a logic circuit for producing the restart signal of an asynchronous read as a logic OR between an inverted control pulse and a logic AND between the output of said second latch and the inverted second detection signal.

8. An interleaved memory according to claim 7, wherein said load circuit comprises:

a first multiplexer controlled by the least significant address bit being input with a pair of transfer signals of data read from said first and second banks of memory cells;

a first latch being set by the synchronous read start signal, and reset by the load pulse for producing a synchronization signal;

a second multiplexer controlled by the discrimination signal and having an input for receiving a pair of logic signals formed by a logic AND between an inverted command signal for enabling said at least one output data buffer and an inverted output of said first multiplexer, and by a logic AND between the inverted command signal for enabling said at least one output data buffer and an inverted output of said first multiplexer and the synchronization signal;

a pulse generator in cascade to said second multiplexer for producing a pulse having a pre-established duration upon activation of said second multiplexer;

a first logic circuit producing the load pulse as a logic AND between the pulse produced by said pulse generator and an inverted asynchronous read start signal delayed on a transition edge from the first logic state to the second logic state; and a second logic circuit for respectively producing the load commands as a logic AND between the least significant address bit and the load pulse, and as a logic AND between the inverted least significant address bit and the load pulse.

9. An interleaved memory according to claim 8, wherein said at least one output data buffer comprises a precharge circuit for precharging an output node to an intermediate voltage between voltages corresponding to two different logic states of the data being output.

10. An interleaved memory readable in a sequential access synchronous mode and in a random access asynchronous mode, the interleaved memory comprising:

first and second banks of memory cells;

at least one input address buffer;

a first address counter connected between said first bank of memory cells and said at least one input address buffer, and a second address counter connected between said second bank of memory cells and said at least one input address buffer;

a first sensing circuit connected to said first bank of memory cells, and a second sensing circuit connected to said second bank of memory cells;

an address transition detector circuit connected to said at least one input address buffer for detecting a change in an input address received thereby, said address transition detector circuit operating as a synchronous clock for the interleaved memory;

at least one output data buffer; and a control circuit having inputs for receiving external command signals for enabling the memory and for enabling said at least one output data buffer, said control circuit for recognizing the sequential access synchronous mode or the random access asynchronous mode by enabling a comparison of a currently received input address with an address stored in said first and second address counters.

11. An interleaved memory according to claim 10, wherein said at least one output data buffer comprising a precharge circuit for precharging an output node to an intermediate voltage between voltages corresponding to two different logic states of data being output.

12. An interleaved memory according to claim 10, wherein said address transition detector circuit comprises:

an address transition detector connected to said at least one input address buffer for producing a detection pulse based upon the change in the received input address; and a delay circuit connected to said address transition detector for delaying and extending duration of the detection pulse for producing a detection signal.

13. An interleaved memory according to claim 12, further comprising an internal data bus for transferring data in said first and second sensing circuits to said at least one output data buffer under control of a load signal specific to one of said first and second banks of memory cells.

14. An interleaved memory according to claim 13, wherein the control circuit generates the load signal, and discriminates a requested reading mode based upon an internally generated synchronous read start signal and an asynchronous read start signal, with the synchronous read start signal being active when a new address coincides with an address stored in one of said first and second address counters based upon enabling of the detection signal.

15. An interleaved memory according to claim 14, wherein the asynchronous read start signal assumes a first logic state when the new address differs from addresses stored in said first and second address counters based upon the enabling of the detection signal, with a transition to the first logic state of the asynchronous read start signal enabling acquisition of an address in said first and second address counters, and start of a new random access asynchronous read cycle with a simultaneous activation of said first and second sensing circuits, with the external command signal for enabling said at least one output data buffer acting as an enabling signal for transferring data read from said first and second banks of memory cells currently in priority to said at least one output data buffer, based upon a value of a least significant address bit of the input address.

16. An interleaved memory according to claim 15, wherein the return of the asynchronous read start signal to a second logic state causes after a certain delay switching to the sequential access synchronous read mode by generating, within said control circuit, a first increment pulse for said first or second address counter of said first or second bank of memory cells currently not in priority, for implementing an outphasing between said first and second bank of memory cells from a first synchronous mode read cycle depending on the value assumed by the least significant address bit, and progressing under control of the synchronous read start signal and under control of a third command signal for loading data in said at least one output data buffer, with the third command signal being internally generated in said control circuit.

17. An interleaved memory according to claim 10, wherein said first and second sensing circuits are functionally independent from each other.

18. An interleaved memory according to claim 10, further comprising:
   a first data register connected between said first sensing circuit and said at least one output data buffer; and
   a second data register connected between said second sensing circuit and said at least one output data buffer.

19. An interleaved memory according to claim 10, wherein the asynchronous read start signal assumes the first logic state even when a restart signal for an asynchronous reading produced by the control circuit is active.

20. An interleaved memory according to claim 10, wherein said control circuit comprises:
   an increment circuit for generating increment pulses for said first and second address counters, and being stimulated by the asynchronous read start signal during a first asynchronous reading and by the load pulse during synchronous readings successive to the first asynchronous read;
   a load circuit for producing load commands equal to the load pulse based upon the least significant address bit identifying one of said first and second banks of memory cells, with the load pulse being produced based upon the asynchronous read start signal and transfer signals of data read from said first and second banks of memory cells; and
   a restart circuit for producing the restart signal for the asynchronous reading when a change of address occurs before an end of a synchronous or asynchronous read cycle.

21. An interleaved memory according to claim 20, wherein the increment circuit comprises:
   a latch being set by the asynchronous read start signal and being reset by the load pulse, and producing a discrimination signal for discriminating an asynchronous read from a successive synchronous read;
   a first multiplexer controlled by the discrimination signal and having an input for receiving a delayed replica of the asynchronous read start signal and an inverted load pulse;
   a pulse generator connected in cascade to said first multiplexer for producing a pulse having a pre-established duration when an output of said first multiplexer is enabled;
   a logic circuit for producing a general increment pulse as a logic AND between the pulse produced by said pulse generator and an inverted asynchronous read start signal delayed on a transition edge from a first logic state to a second logic state, and a logic OR between the least significant address bit identifying one of said first and second banks of memory cells and an inverted discrimination signal;
   a second multiplexer controlled by the discrimination signal and having an input for receiving the least significant address bit and an inverted least significant address bit; and
   a logic circuit for producing the increment pulse as a logic AND between the general increment pulse and an inverted output signal from said second multiplexer, or as a logic AND between the general increment pulse and the output signal from said second multiplexer.

22. An interleaved memory according to claim 21, wherein said restart circuit comprises:
   a pulse generator for producing a control pulse based upon activation of the external command signal for enabling the memory;
   a first latch being set by an inverted second detection signal obtained as a logic AND between a control pulse and the detection pulse, and being reset by a reset signal obtained as logic AND between the general increment pulse and an inverted discrimination signal;
   a second latch being set by a logic AND of an output of said first latch and of a second detection signal, and being reset by a logic NOR of an output of said first latch and the reset signal; and
   a logic circuit for producing the restart signal of an asynchronous read as a logic OR between an inverted control pulse and a logic AND between the output of said second latch and the inverted second detection signal.

23. An interleaved memory according to claim 22, wherein said load circuit comprises:
   a first multiplexer controlled by the least significant address bit being input with a pair of transfer signals of data read from said first and second banks of memory cells;
   a first latch being set by the synchronous read start signal, and reset by the load pulse for producing a synchronization signal;
   a second multiplexer controlled by the discrimination signal and having an input for receiving a pair of logic signals formed by a logic AND between an inverted command signal for enabling said at least one output data buffer and an inverted output of said first multiplexer, and by a logic AND between the inverted command signal for enabling said at least one output data buffer and an inverted output of said first multiplexer and the synchronization signal;
   a pulse generator in cascade to said second multiplexer for producing a pulse having a pre-established duration upon activation of said second multiplexer;
   a first logic circuit producing the load pulse as a logic AND between the pulse produced by said pulse generator and an inverted asynchronous read start signal delayed on a transition edge from the first logic state to the second logic state; and
   a second logic circuit for respectively producing the load commands as a logic AND between the least significant address bit and the load pulse, and as a logic AND between the inverted least significant address bit and the load pulse.

24. A method for operating an interleaved memory readable in a sequential access synchronous mode and in a random access asynchronous mode, the interleaved memory comprising first and second banks of memory cells, at least one input address buffer, a first address counter connected between the first bank of memory cells and the at least one input address buffer, a second address counter connected between the second bank of memory cells and the at least one input address buffer, a first sensing circuit connected to the first bank of memory cells, a second sensing circuit connected to the second bank of memory cells, and at least one output data buffer, the method comprising:
   detecting a change in an input address received by the at least one input address buffer using an address transition detector circuit connected thereto, with the address transition detector circuit operating as a synchronous clock for the interleaved memory; and recognizing the sequential access synchronous mode or the random access asynchronous mode by comparing a currently received input address with an address stored in the first and second address counters.

25. A method according to claim 24, further comprising precharging an output node to an intermediate voltage between voltages corresponding to two different logic states of data being output.

26. A method according to claim 24, wherein the detecting comprises:

producing a detection pulse based upon the change in the input address received by the at least one input address buffer; and delaying and extending duration of the detection pulse for producing a detection signal.

27. A method according to claim 26, further comprising transferring data in the first and second sensing circuits to the at least one output data buffer under control of a load signal specific to one of the first and second banks of memory cells.

28. A method according to claim 27, wherein the recognizing is performed using a control circuit for generating the load signal; and discriminating a requested reading mode based upon an internally generated synchronous read start signal and an asynchronous read start signal, with the synchronous read start signal being active when a new address coincides with an address stored in one of the first and second address counters based upon enabling of the detection signal.

29. A method according to claim 28, wherein the asynchronous read start signal assumes a first logic state when the new address differs from addresses stored in the first and second address counters based upon the enabling of the detection signal, with a transition to the first logic state of the asynchronous read start signal enabling acquisition of an address in the first and second address counters, and start of a new random access asynchronous read cycle with a simultaneous activation of the first and second sensing circuits, with an external command signal for enabling the at least one output data buffer acting as an enabling signal for transferring data read from the first and second banks of memory cells currently in priority to the at least one output data buffer, based upon a value of a least significant address bit of the input address.

30. A method according to claim 29, wherein the return of the asynchronous read start signal to a second logic state causes after a certain delay switching to the sequential access synchronous read mode by generating, within the control circuit, a first increment pulse for the first or second address counter of the first or second bank of memory cells currently not in priority, implementing an outphasing between the first and second bank of memory cells from a first synchronous mode read cycle depending on the value assumed by the least significant address bit, progressing under control of the synchronous read start signal and under control of a third command signal for loading data in the at least one output data buffer, with the third command signal being internally generated in the control circuit.

31. A method according to claim 24, wherein the first and second sensing circuits are functionally independent from each other.

32. A method according to claim 24, wherein the asynchronous read start signal assumes a first logic state when a restart signal for an asynchronous reading produced by the control circuit is active.

* * * * *